(12) United States Patent
Chu et al.

(10) Patent No.: US 9,768,288 B2
(45) Date of Patent: Sep. 19, 2017

(54) CARBON NANOSTRUCTURE DEVICE FABRICATION UTILIZING PROTECT LAYERS

(71) Applicant: INTERNATIONAL BUSINESS MACHINES CORPORATION, Armonk, NY (US)

(72) Inventors: Jack O. Chu, Manhasset Hills, NY (US); Christos D. Dimitrakopoulos, Baldwin Place, NY (US); Alfred Grill, White Plains, NY (US); Timothy J. McArdle, Mahopac, NY (US); Dirk Pfeiffer, Croton on Hudson, NY (US); Katherine L. Saenger, Ossining, NY (US); Robert L. Wisnieff, Ridgefield, CT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/237,350

(22) Filed: Aug. 15, 2016

(65) Prior Publication Data
US 2017/0186881 A1    Jun. 29, 2017

Related U.S. Application Data

(62) Division of application No. 14/480,472, filed on Sep. 8, 2014, now abandoned, which is a division of application No. 13/654,416, filed on Oct. 18, 2012, now Pat. No. 8,828,762.

(51) Int. Cl.
*H01L 21/00* (2006.01)
*H01L 21/84* (2006.01)
*H01L 21/20* (2006.01)
*H01L 29/775* (2006.01)
*H01L 21/30* (2006.01)
*H01L 29/66* (2006.01)
(Continued)

(52) U.S. Cl.
CPC .......... *H01L 29/775* (2013.01); *H01L 21/02* (2013.01); *H01L 21/30* (2013.01); *H01L 29/66* (2013.01); *H01L 51/00* (2013.01)

(58) Field of Classification Search
CPC ......... H01L 29/77; H01L 21/02; H01L 21/30; H01L 29/78; H01L 51/00
USPC ........................ 438/34, 151, 386; 257/29, 38
See application file for complete search history.

(56) References Cited

U.S. PATENT DOCUMENTS

| 6,188,120 B1 | 2/2001 | Andricacos et al. |
| 7,547,568 B2 | 6/2009 | Chou et al. |
| 7,749,886 B2 | 7/2010 | Oganesian et al. |

(Continued)

OTHER PUBLICATIONS

Robinson, J.A. et al., Contacting Graphene, Appl. Phys. Lett. 98 053103 (2011).

(Continued)

*Primary Examiner* — Jessica Manno
*Assistant Examiner* — Sheikh Maruf
(74) *Attorney, Agent, or Firm* — Louis J. Percello; Robert M. Trepp

(57) ABSTRACT

Hall effect devices and field effect transistors are formed incorporating a carbon-based nanostructure layer such as carbon nanotubes and/or graphene with a sacrificial metal layer formed there over to protect the carbon-based nanostructure layer during processing.

7 Claims, 8 Drawing Sheets

(51) Int. Cl.
*H01L 21/02* (2006.01)
*H01L 51/00* (2006.01)

(56) References Cited

U.S. PATENT DOCUMENTS

| | | | |
|---|---|---|---|
| 8,405,189 B1* | 3/2013 | Ward | H01L 28/40 257/532 |
| 2005/0266605 A1 | 12/2005 | Kawakami | |
| 2007/0232013 A1 | 10/2007 | Manning et al. | |
| 2008/0254600 A1 | 10/2008 | Liu et al. | |
| 2009/0004831 A1 | 1/2009 | Chu et al. | |
| 2009/0020764 A1* | 1/2009 | Anderson | H01L 29/1606 257/77 |
| 2009/0272967 A1* | 11/2009 | Afzali-Ardakani | B82Y 10/00 257/40 |
| 2009/0278233 A1 | 11/2009 | Pinnington et al. | |
| 2010/0051960 A1* | 3/2010 | Chen | H01L 29/1606 257/76 |
| 2010/0195392 A1 | 8/2010 | Freeman | |
| 2011/0059599 A1 | 3/2011 | Ward et al. | |
| 2011/0068323 A1* | 3/2011 | Chen | B82Y 10/00 257/24 |
| 2011/0114918 A1* | 5/2011 | Lin | H01L 29/1606 257/24 |
| 2011/0127488 A1* | 6/2011 | Brown | B82Y 10/00 257/9 |
| 2011/0133169 A1* | 6/2011 | Bangsaruntip | B82Y 10/00 257/38 |
| 2011/0268884 A1* | 11/2011 | Wind | B82Y 10/00 427/272 |
| 2012/0107562 A1* | 5/2012 | Bolotin | B81C 1/00595 428/156 |
| 2012/0298962 A1* | 11/2012 | Avouris | H01L 29/4908 257/27 |
| 2012/0326126 A1* | 12/2012 | Chen | H01L 29/42384 257/29 |
| 2013/0059134 A1* | 3/2013 | Chai | B82Y 10/00 428/201 |
| 2013/0287956 A1 | 10/2013 | Patil | |

OTHER PUBLICATIONS

Farmer, D. et al., Appl. Phys. Lett. 97 013103 (2010).
Unarunotai, S. et al., ACS-NANO 10 5591 (2010).
Wang, W. M. et al. Dip-Pen Nanolithography of Electrical Contacts to Single Graphene Flakes, ACS NANO, 4(11), 6409-6416 (Nov. 2010).
Unarunotai, S., Appl. Phys. Lett. 95, 202101 (2009).
Appenzeller, J., Proc. IEEE, vol. 96, pp. 201-211, (2008).
Morales, A. M. et al. Sacrificial layer for the fabrication of electroformed cantilevered LIGA microparts. Proceedings of SPIE—The international Society of Optical Engineering, Micromachining and Microfabrication Process Technology VIII, 2003 4979, pp. 448-455.

\* cited by examiner

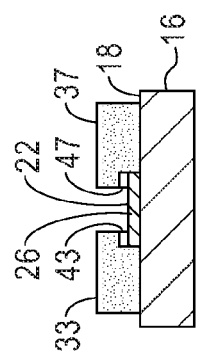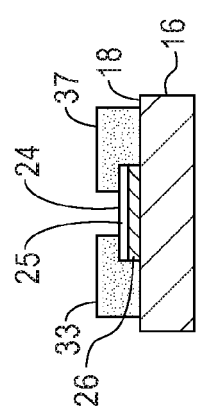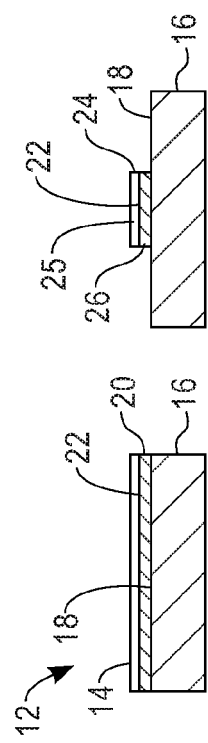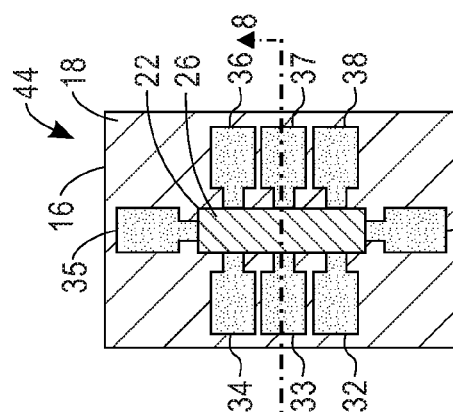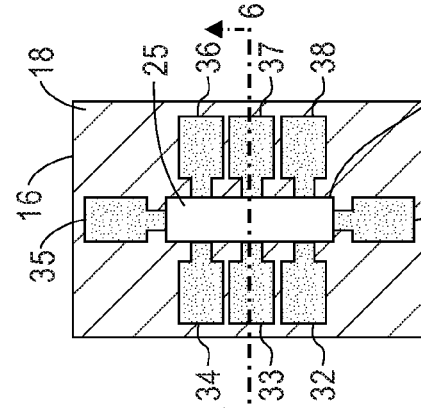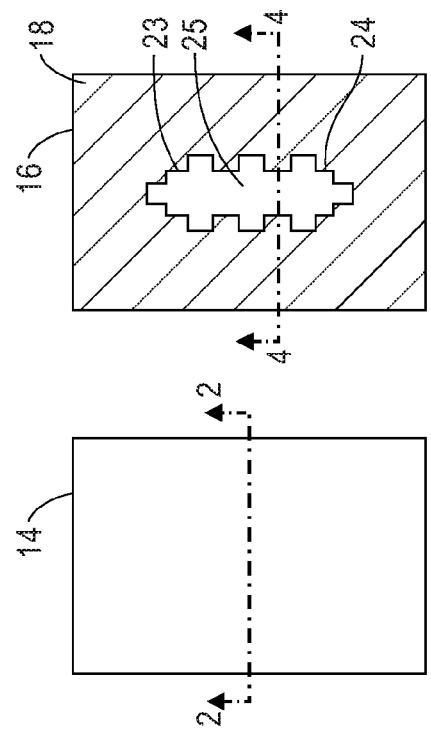

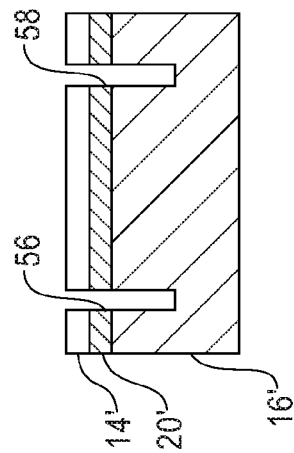
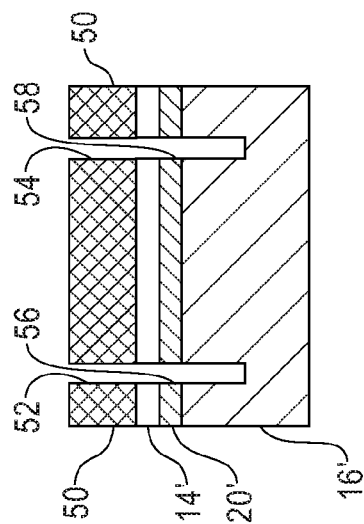
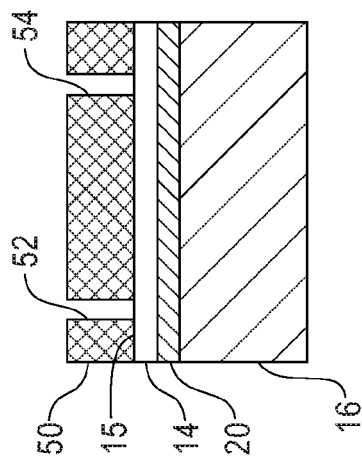
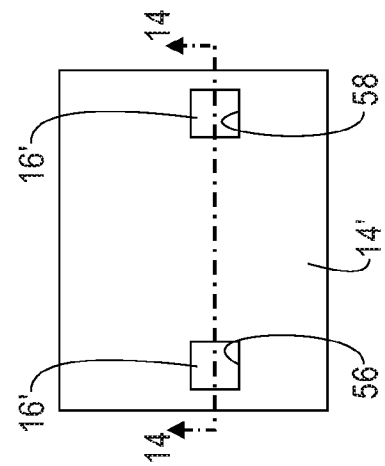
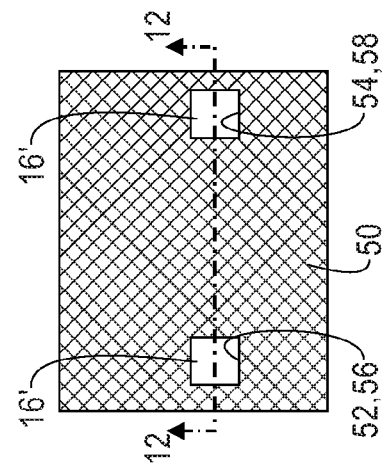
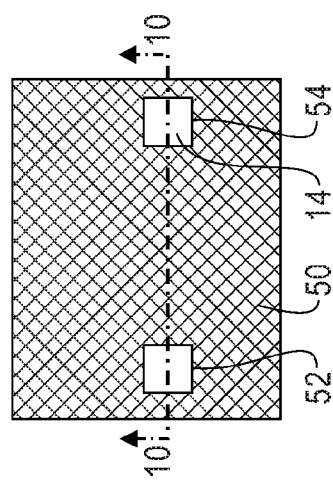

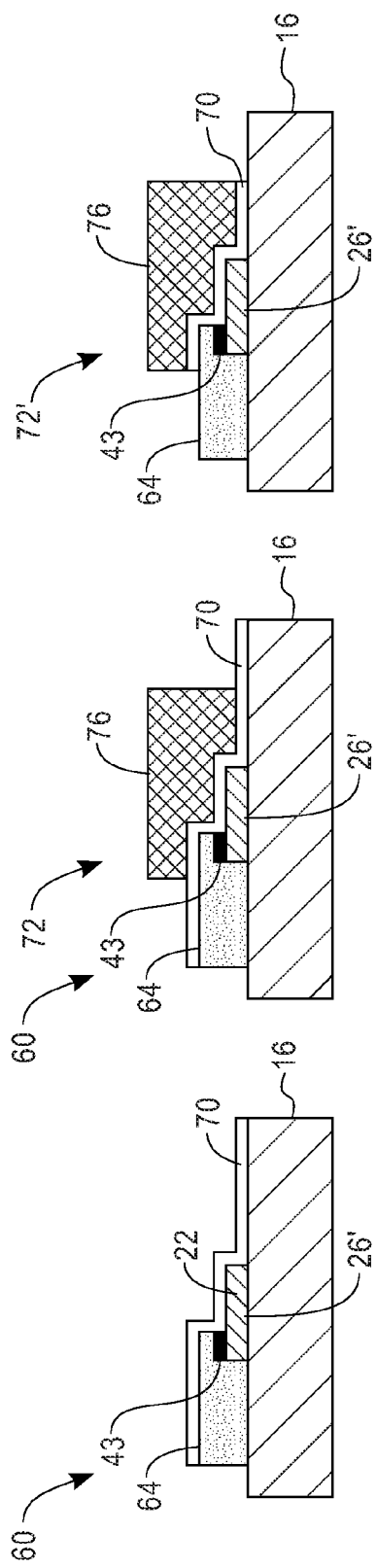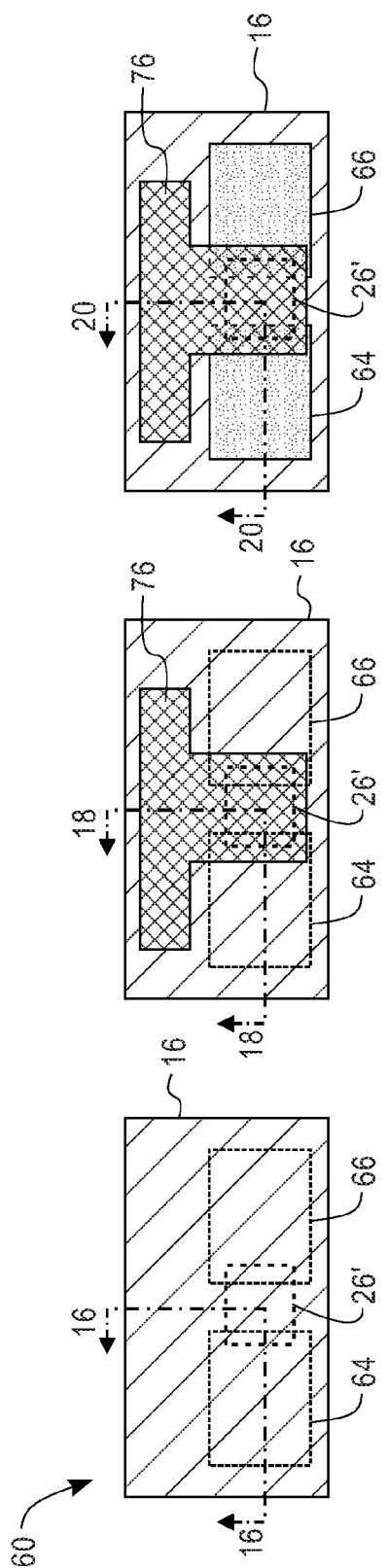

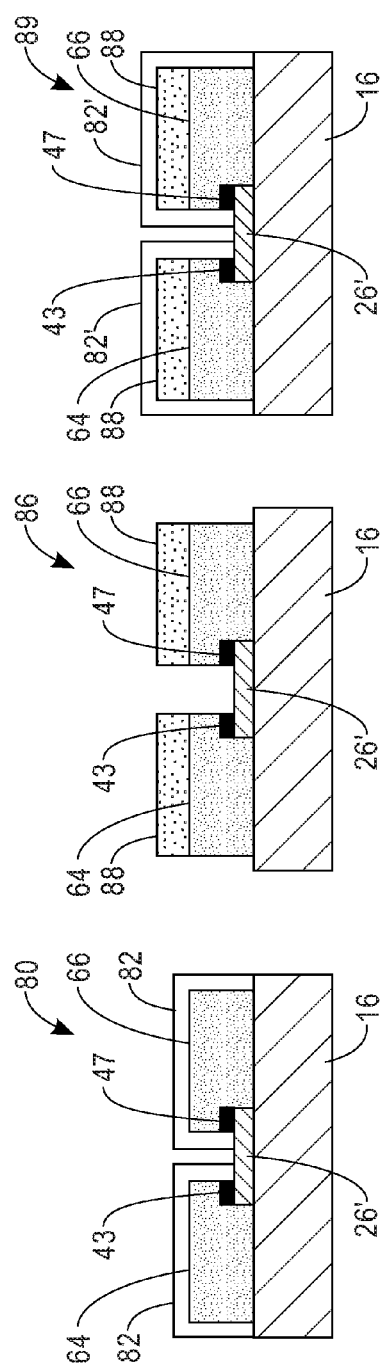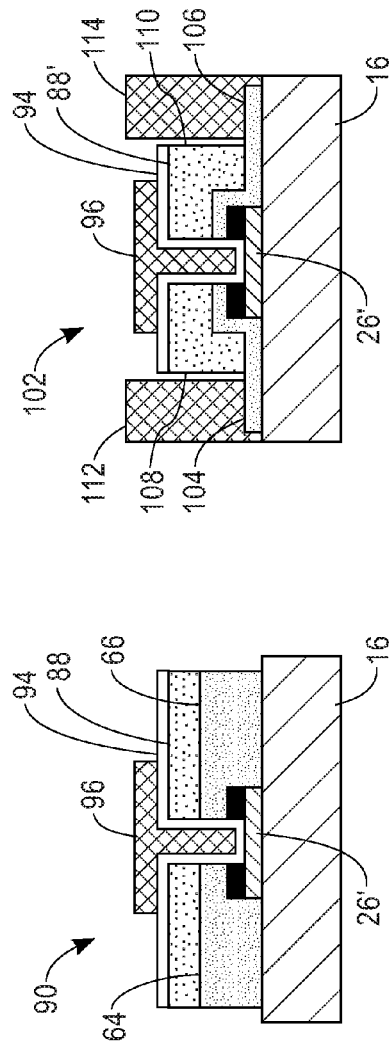

CARBON NANOSTRUCTURE DEVICE FABRICATION UTILIZING PROTECT LAYERS

GOVERNMENT CONTRACT

This invention was made with Government support under Contract No. FA8650-08-C-7838 awarded by Defense Advanced Research Projects Agency (DARPA). The Government has certain rights in this invention.

BACKGROUND

The present invention relates to Hall effect devices and field effect transistors (FETs) incorporating a carbon-based nanostructure layer, and more specifically, to Hall effect and FET devices incorporating high-carrier mobility carbon-based nanostructure layers patterned by methods utilizing inorganic sacrificial channel protect layers.

The integration of carbon-based nanostructures as channel materials in the next generation of electronic devices offers many advantages over the continued scaling of silicon (Si). Carbon nanotubes (CNT's) and graphene are two nanoscale forms of carbon that exhibit extremely high current carrying capacity and mobilities several orders of magnitude beyond the theoretical limit for Si. Additionally, CNTs (1 dimension) and graphene (2 dimensions) are low-dimensional (ultra thin-body) materials, allowing them to be aggressively scaled in field-effect transistors without incurring deleterious short-channel effects that plague modern scaled devices.

BRIEF SUMMARY OF THE INVENTION

Described here are CNT and graphene device structures and methods of making that utilize sacrificial channel-protect layers to keep the CNT or graphene from being exposed to undesirable organic moieties present during resist processing steps. The methods may be employed to fabricate a variety of CNT or graphene devices including Hall bars, gated Hall bars, and field effect transistors (FETs).

In accordance with the present invention, a method is provided for forming a device structure, the method comprising selecting an insulating substrate having a carbon-based nanostructure layer on an upper surface; forming a first layer of a first metal on the carbon-based nanostructure layer; forming a first patterned layer having a first pattern on the first layer of first metal; transferring the first pattern to the first layer of a first metal and the carbon-based nanostructure layer to form a first patterned layer of a first metal and a first patterned carbon-based nanostructure layer there under; removing the first patterned layer; forming a second patterned layer of a second metal over the insulating substrate and the first patterned layer of a first metal, the second patterned layer of a second metal having a second pattern comprising a plurality of contacts spaced apart from one another wherein respective contacts have a portion on the first patterned layer of a first metal and a portion on the insulating substrate; and removing the first patterned layer of a first metal where not covered by the plurality of contacts whereby the first patterned carbon-based nanostructure layer has regions not covered by the first patterned layer of first metal.

The invention further provides a device structure comprising an insulating substrate; a first patterned layer of carbon-based nanostructure layer on the substrate; a first patterned layer of a first metal on the first patterned carbon-based nanostructure layer; and a plurality of spaced apart contacts having a portion on the patterned metal layer and a portion on the insulating substrate; the first patterned carbon-based nanostructure layer having regions not covered by the first patterned layer of a first metal.

The invention further provides a method for forming a device structure comprising selecting an insulating substrate having a carbon-based nanostructure layer on an upper surface; forming a first layer of a first metal on the carbon-based nanostructure layer; forming a first patterned layer having a first pattern on the first layer of a first metal; transferring the first pattern to the first layer of a first metal and the carbon-based nanostructure layer to form a first patterned layer of a first metal and a first patterned carbon-based nanostructure layer there under; removing the first patterned layer; forming a layer of first material over the insulating substrate and the first patterned layer of a first metal, the layer of first material reactive with the first patterned layer of a first metal when raised to a predetermined temperature; optionally forming a layer of second material over the layer of first material; the layer of second material providing an electrically conductive diffusion barrier with respect to the layer of first material; forming a second layer of metal over the layer of second material; patterning the second layer of metal, the layer of second material, and the layer of first material to form source and drain regions spaced apart wherein respective regions have a portion on the patterned metal and a portion on the insulating substrate; heating the layer of first material on the patterned first metal to cause a reaction there between for forming a reacted region of one of a chemical compound and an alloy; and selectively removing unreacted patterned first metal to expose the patterned carbon-based nanostructure layer between the source region and the drain region.

The invention also includes the aforementioned methods in combination with additional steps for gate dielectric and gate formation, to fabricate, for example, gated Hall structures and FET devices incorporating high-carrier mobility carbon-based nanostructure layers. The invention also includes the aforementioned methods implemented on insulating substrates that include at least one embedded gate with a gate dielectric layer thereupon, to fabricate, for example bottom gate or dual gate FET devices incorporating high-carrier mobility carbon-based nanostructure layers.

BRIEF DESCRIPTION OF THE SEVERAL VIEWS OF THE DRAWINGS

These and other features, objects, and advantages of the present invention will become apparent upon consideration of the following detailed description of the invention when read in conjunction with the drawing in which:

FIG. 1 is a top view of a structure comprising an insulating base substrate, a carbon-based nanostructure layer on the base substrate, and a metal layer on the carbon-based nanostructure layer.

FIG. 2 is a cross-section view along the lines 2-2 of FIG. 1.

FIG. 3 is a top view of the substrate of FIG. 1 after patterning of the metal layer and carbon-based nanostructure layer.

FIG. 4 is a cross-section view along the lines 4-4 of FIG. 3.

FIG. 5 is a top view of an intermediate structure.

FIG. 6 is a cross-section view along the lines 6-6 of FIG. 5.

FIG. 7 is a top view of a Hall effect device.

FIG. 8 is a cross-section view along the lines 8-8 of FIG. 7.

FIG. 9 is a top view of a patterned mask.

FIG. 10 is a cross-section view along the lines 10-10 of FIG. 9.

FIG. 11 is a top view of a patterned mask after etching.

FIG. 12 is a cross-section view along the lines 12-12 of FIG. 11.

FIG. 13 is a top view of a patterned metal layer, carbon-based nanostructure layer and substrate.

FIG. 14 is a cross-section view along the lines 14-14 of FIG. 13.

FIG. 15 is a top view of an intermediate structure of an FET.

FIG. 16 is a cross-section view along the lines 16-16 of FIG. 15.

FIG. 17 is a top view of an intermediate structure of an FET.

FIG. 18 is a cross-section view along the lines 18-18 of FIG. 17.

FIG. 19 is a top view of a FET.

FIG. 20 is a cross-section view along the lines 20-20 of FIG. 19.

FIG. 21 is a cross-section view of an intermediate structure showing a dielectric layer on the top and sidewalls of a source and drain of a FET and yet absent from graphene in the channel region.

FIG. 22 is a cross-section view of an intermediate structure showing a dielectric layer on the top of a source and drain of a FET.

FIG. 23 is a cross-section view of an intermediate structure showing the combination of the dielectric layers of FIGS. 21 and 22

FIG. 24 is a cross-section view of an FET incorporating a single-part source and drain and using the extra dielectric layer of FIG. 22.

FIG. 25 is a cross-section view of an FET incorporating a two-part source and drain comprising extension regions and using the extra dielectric layer of FIG. 22.

DETAILED DESCRIPTION

Figure 26:
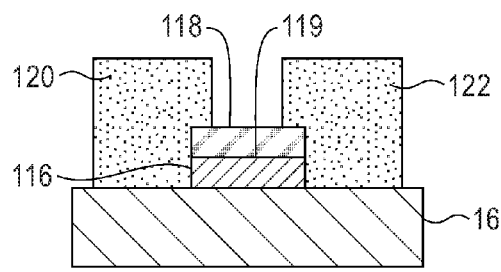
FIGS. 26-31 are cross-section views illustrating the process flow for forming an FET with a one-part source and drain, no additional source and drain dielectric, and reacted channel-protect residuals for the case of a conductive reactive layer.

Referring now to the drawings, FIGS. 1-8 show top views and cross section views of intermediate and final structures of a Hall effect device having a Hall bar structure. FIG. 1 shows a top view of sacrificial metal layer 14 which functions to protect an upper surface 22 of carbon-based nanostructure layer 20 shown in FIG. 2 from contamination such as from hydrocarbons and other contamination. FIG. 2 is a cross section view along the lines 2-2 of FIG. 1. For example, contamination of upper surface 22 of carbon-based nanostructure layer 20 may come from residuals of a photoresist used to pattern carbon-based nanostructure layer 20. Structure 12 comprises an insulating substrate 16, a carbon-based nanostructure layer 20 and sacrificial metal layer 14. Sacrificial metal layer 14 is referred to as sacrificial because significant portions of sacrificial metal layer 14 are present only temporarily and are intended for subsequent removal. Insulating substrate 16 may be for example SiC, or $SiO_2$ over Si. Insulating substrate 16 has an upper surface 18. Carbon-based nanostructure layer 20 is formed or positioned on upper surface 18. Carbon-based nanostructure 20 has an upper surface 22 and may be selected from the group consisting of carbon-nanotubes and graphene. Sacrificial metal layer 14 is formed on upper surface 22 of carbon-based nanostructure layer 20. Sacrificial metal layer 14 may be selected from the group consisting of Ni, Pd, Cu, and other metals.

A first patterned layer (not shown) such as a photoresist having a first pattern 23 is formed on sacrificial metal layer 14. First patterned layer may be patterned by photolithography, for example, by a photoresist which is exposed with light passing through a mask containing first pattern 23. The photoresist is subsequently developed. First pattern 23 is then transferred to sacrificial metal layer 14 and to carbon-based nano structure layer 20 to form first patterned sacrificial metal 24 and first patterned carbon-based nanostructure layer 26 shown in FIGS. 3 and 4.

FIG. 3 is a top view of patterned sacrificial metal layer 24. FIG. 4 is a cross-section view along the lines 4-4 of FIG. 3. Patterned sacrificial metal layer 24 has an upper surface 25 and functions both as an etching mask and to protect the upper surface 22 of first patterned carbon-based nanostructure layer 26. Carbon-based nanostructure layer 26 is preferably etched with an etchant selective to insulating substrate 16. Etching is typically performed by reactive ion etching (RIE), plasma etching, ion beam etching, or sputter etching in a working gas. The working gas may be a single gas or a mixture of gases and is typically an oxygen-containing gas.

FIG. 5 is a top view of the structure of FIG. 3 after a plurality of metal contacts 31-38 spaced apart from one another has been formed such as by an additive process consisting of blanket metal deposition onto a patterned photoresist lift-off stencil (not shown) followed by removal of the lift-off stencil and overlying metal; or a subtractive process consisting of metal layer deposition, formation of a patterned photoresist mask on the metal layer, followed by removal of exposed regions of the metal layer to form a plurality of contacts 31-38. The patterned photoresist mask is subsequently removed. FIG. 6 is a cross section view along the lines 6-6 of FIG. 5. As shown in FIG. 6, contacts 33 and 37 have a portion on upper surface 25 of patterned sacrificial metal layer 24 and a portion on upper surface 18 of insulating substrate 16. Contacts 31, 32, 34-36 and 38 likewise have a portion on upper surface 25 of patterned sacrificial metal layer 24 and a portion on upper surface 18 of insulating substrate 16.

FIG. 7 is a top view of Hall bar structure 44 after patterned sacrificial metal layer 24 is etched with an etchant selective to carbon-based nanostructure layer 26. Plurality of contacts 31-38 function as a mask during etching. The etchant removes the patterned sacrificial metal layer 24 where not covered by plurality of contacts 31-38 leaving regions of insulating substrate 16 and first patterned carbon-based nanostructure layer 26 exposed where not covered by first patterned sacrificial metal layer 24.

FIG. 8 is a cross-section view along the lines 8-8 of FIG. 7. Remaining portions 43 and 47 of patterned sacrificial metal layer 24 remain under contacts 33 and 37 as shown in FIG. 8. Additional remaining portions of first patterned sacrificial metal layer 24 also remain under contacts 31, 32, 34-36 and 38. The metal selected for first patterned sacrificial metal layer 24 should provide low contact resistance such as below 1e-05 ohm $cm^2$ to respective contacts 31-38 and to first patterned carbon-based nanostructure layer 26.

Alignment marks (not shown in FIGS. 1-8) are typically utilized to facilitate subsequent alignment of masks during patterning. FIGS. 9-14 illustrate a method for forming alignment marks in structure 12 shown in FIGS. 1 and 2. Starting with structure 12 of FIGS. 1 and 2, photoresist layer 50 is formed on upper surface 15 of sacrificial layer 14 and patterned to provide two spaced apart alignment mark openings 52 and 54 such as squares in photoresist layer 50, as shown in top view in FIG. 9. Sacrificial metal layer 14 is shown at the bottom of alignment mark openings 52 and 54. FIG. 10 is a cross-section view along the lines 10-10 of FIG. 9 showing alignment mark openings 52 and 54.

FIG. 11 is a top view showing alignment marks 56 and 58 in photo resist layer 50, carbon-based nanostructure layer 20' (shown in FIG. 12) and extending into insulating substrate 16'. FIG. 12 is a cross-section view along the lines 12-12 of FIG. 11. An etchant is used to extend alignment mark openings 52 and 54 through sacrificial layer 14', carbon-based nanostructure layer 20' and into insulating substrate 16' to form alignment marks 56 and 58. FIG. 13 is a top view of sacrificial metal layer 14' after photoresist layer 50 has been removed. FIG. 14 is a cross-section view along the lines 14-14 of FIG. 13 showing alignment marks 56 and 58. Further processing such as shown by FIGS. 3-8 may be performed where the alignment marks aid in pattern alignment.

FIG. 15 is a top view of an intermediate structure 60 of a field effect transistor. FIG. 16 is a cross section view along the lines 16-16 of FIG. 15. The process steps needed to form intermediate structure 60 correspond to the processes described with regard to FIGS. 1-8. In FIGS. 15 and 16, an insulating substrate 16 having a first patterned carbon-based nanostructure layer 26' thereon is shown. First patterned carbon-based nanostructure layer 26' has an upper surface 22 with remaining portion 43 of patterned sacrificial metal layer 24 thereon. Source 64 and drain 66 are similar to contacts 33 and 37 shown in FIG. 8. A gate dielectric layer 70 is formed over insulating substrate 16, source 64, first patterned carbon-based nanostructure layer 26' and drain 66. Gate dielectric layer 70 may be selected from the group consisting of the oxides and insulating oxynitrides of Si; oxides and insulating oxynitrides of metals such as Al, Hf, Y and other metals and their mixtures; the above oxides and oxynitrides used with an underlying buffer or seed layers such as an organic seed layer made from a derivative of polyhydroxystyrene (the polymer NFC 1400-3CP manufactured by JSR Micro, Inc., 1280 Mathilda Ave., Sunnyvale, Calif.).

FIG. 17 is a top view of field effect transistor 72 comprising intermediate structure 60 shown in cross-section in FIG. 18 and a patterned conductive gate electrode 76 on gate dielectric layer 70. FIG. 18 is a cross-section view along the lines 18-18 of FIG. 17. Gate electrode 76 may be patterned by an additive process (e.g., lift-off) or a subtractive process (gate layer deposition followed by gate layer removal in selected areas). Gate electrode 76 may comprise any suitable metal or combinations of metals, for example, Ti/Au (e.g., 5 nm of Ti followed by 25 nm of Au), Cr/Au, Ti/Pd/Au, etc.

FIG. 19 is a top view of field effect transistor 72'. FIG. 20 is a cross-section view along the lines 20-20 of FIG. 19. At least some portions of gate dielectric layer 70 over source 64 and drain 66 would typically be removed to facilitate subsequent electrical contacts to conductive interconnect structures. In FIGS. 19 and 20, gate dielectric layer 70 is shown as removed in all regions where not under gate electrode 76, for example, by a process in which gate electrode 76 is used as a mask during gate dielectric etching.

FIGS. 21-23 are cross-section views of alternative intermediate structures which may be used in place of intermediate structure 60 in FIG. 16 where dielectric layers 82, 88, or 88 and 82' are formed to reduce capacitance to the gate electrode 96 shown in FIG. 24. In contrast to intermediate structure 60 of FIG. 16, which is shown in cross section taken through lines 16-16 in FIG. 15, cross-section views of alternative intermediate structures 80, 86, and 89 are shown through a line passing from source to drain, though the channel. FIGS. 21-23 may be completed according to the steps shown in FIGS. 17-20 where a gate electrode is formed and the gate dielectric is selectively removed. FIG. 21 is a cross-section view of intermediate structure 80 showing a dielectric layer 82 on the top and sidewalls on source 64 and drain 66 of a field effect transistor to be formed. Dielectric layer 82 is selective to carbon-based nanostructure layer 26' in that it forms on source 64 and drain 66 and remaining portion 43 but not on carbon-based nanostructure layer 26'. Dielectric layer 82 functions to provide additional dielectric spacing (that is, in addition to gate dielectric layer 94 shown in FIG. 24) to space source 64 and drain 66 from a gate electrode 96 shown in FIG. 24, thereby reducing source 64 and drain 66 capacitance to the gate electrode 96.

FIG. 22 is a cross-section view of an intermediate structure 86 showing a dielectric layer 88 on the upper surface of source 64 and drain 66 of a field effect transistor to be formed. Dielectric layer 88 and the layer of metal used to form source 64 and drain 66 are preferably patterned using the same second patterned layer or mask by an additive or subtractive process. Dielectric layer 88 functions to provide additional dielectric spacing (that is, in addition to gate dielectric layer 94 shown in FIG. 24) to space source 64 and drain 66 from gate electrode 96 shown in FIG. 24, thereby reducing source 64 and drain 66 capacitance to the gate electrode 96.

FIG. 23 is a cross-section view of an intermediate structure 89 showing the combination of dielectric layer 82 shown in FIG. 21 and dielectric layer 88 shown in FIG. 22. Dielectric layer 82' is over dielectric layer 88. Dielectric layer 82' and dielectric layer 88 function to provide additional dielectric spacing (that is, in addition to gate dielectric layer 94 shown in FIG. 24) to space source 64 and drain 66 from gate electrode 96 shown in FIG. 24, thereby reducing source 64 and drain 66 capacitance to gate electrode 96.

By way of example, FIG. 24 is a cross-section view of a field effect transistor 90 incorporating a single-part source and drain and extra dielectric layer 88 shown in FIG. 22 to reduce capacitance between source 64 and gate electrode 96 and between drain 66 and gate electrode 96. In FIG. 24 starting with the intermediate structure 86 shown in FIG. 22, a gate dielectric 94 is formed over dielectric layer 88, and first patterned carbon-based nanostructure layer 26'. Gate electrode 96 is formed over gate dielectric 94. Gate electrode 96 may be formed by an additive or subtractive process. These same process steps (also described in connection with FIGS. 17-20) may also be used to form field effect transistors from intermediate structures 80, 86, and 89 of FIGS. 21-23.

FIG. 25 is a cross-section view of a field effect transistor 102 comprising a two-component source and drain. Compared to FIG. 24, source 104 and drain 106 are thinner than source 64 and drain 66 in FIG. 24. Dielectric layer 88' is formed thicker in FIG. 25 than dielectric layer 88 in FIG. 24 to reduce gate electrode 96 capacitance to source 104 and drain 106. Openings 108 and 110 shown in FIG. 25 containing source contact 112 and drain contact 114, respectively, are formed in gate dielectric 94 and dielectric layer 88' to expose the upper surface of source 104 and drain 106. Patterned source contact 112, drain contact 114, and gate electrode 96 may be formed at the same time, concurrently, by an additive process such as lift-off or a subtractive process such as metal layer deposition and etching through a mask. While source and drain contacts 112 and 114 are not shown as directly abutting dielectric layer 88', one or both of these contacts may be slightly spaced apart from dielectric layer 88'; abutting or slightly overlapped with dielectric layer 88'.

Figure 29:
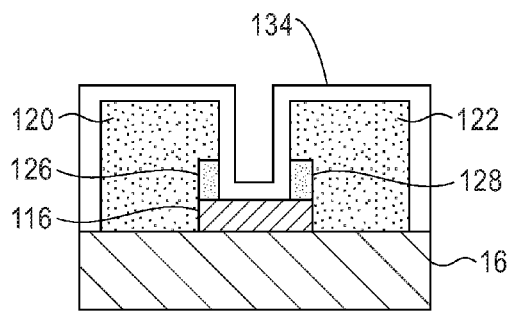
Figure 30:
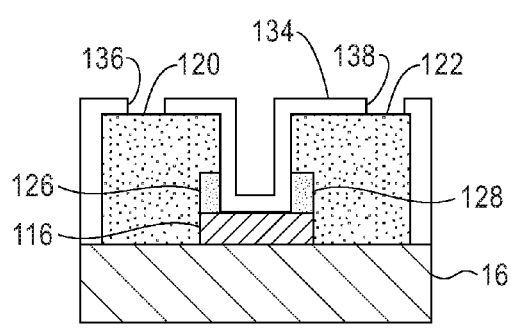
Figure 31:
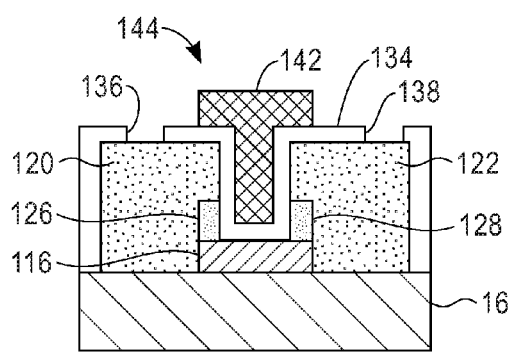

FIGS. 26-31 are cross-section views illustrating the process flow for forming a field effect transistor 144 shown in FIG. 31 wherein a sacrificial metal layer 118 formed to protect a carbon-based nanostructure layer 116 is at least partially reacted with the source 120 and drain 122. Reacted residual regions 126 and 128 are designed to have a greater resistance to the etching process used to remove sacrificial metal layer 118 than the unreacted residual regions 43 and 47 of FIGS. 21-23.

Referring to FIG. 26, an insulating substrate 16 is shown having a patterned carbon-based nanostructure layer 116, and a patterned sacrificial metal layer 118 on the upper surface 119 of patterned carbon-based nanostructure layer 116. Source 120 has a portion overlapping patterned sacrificial metal layer 118 and a portion overlapping insulating substrate 16. Drain 122 has a portion overlapping patterned sacrificial metal layer 118 and a portion overlapping insulating substrate 16. The materials chosen for sacrificial metal layer 118, source 120 and drain 122 are selected to provide a chemical reaction or alloy upon heating to a predetermined temperature.

Figure 27:
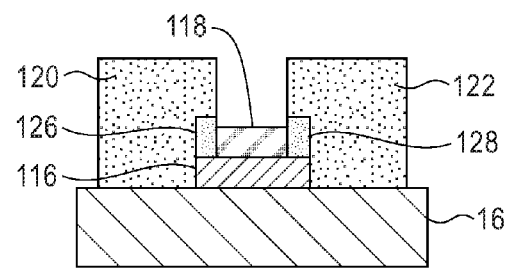

FIG. 27 shows reacted region 126 formed by sacrificial metal layer 118 reacting with source 120. Reacted region 128 is formed by sacrificial metal layer 118 reacting with drain 122. Source 120 and drain 122 may be Pt and sacrificial metal layer 118 may be Pd which react to form a Pt—Pd alloy which would be more resistant to etching than Pd, for example, Pd not alloyed with Pt. It is expected that such Pt—Pd alloys may be formed by annealing at a temperature of 600-750° C. for a time in the range from 1 to 15 minutes and that sacrificial metal layer of Pd may be selectively removed with respect to Pt and the reacted Pt—Pd alloy regions by etching in, for example, a 10:1 solution of $H_2O_2:H_2SO_4$ at 65° C. Alternatively, source 120 and drain 122 may comprise Ni or Pd and sacrificial metal layer 118 may comprise Si, in which case the metals Ni or Pd would react with Si to form reacted regions comprising the silicides $NiSi_x$ or $PdSi_x$. The Ni or Pd and Si choice of materials has the advantage of a wide process window in that Si readily reacts with Ni and/or Pd before it will react with the carbon-based nanostructure 116. Tetramethylammoniumhydroxide (TMAH) is a wet etch suitable for removing Si selectively to Pd and Ni and their silicides, though the metals Pd and Ni are expected to be less resistant to TMAH than their silicides.

Figure 28:
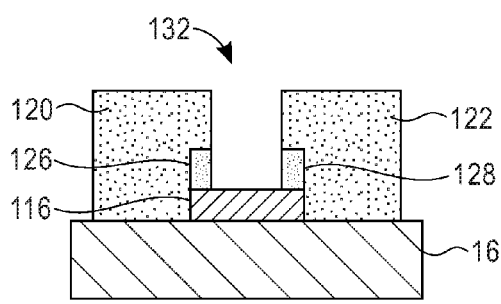

FIG. 28 is a cross-section view after sacrificial metal layer 118 is etched away. FIG. 29 shows a gate dielectric 134 formed over the structure 132 of FIG. 28. FIG. 30 shows openings 136 and 138 formed in gate dielectric 134 to expose the upper surface of source 120 and drain 122. FIG. 31 shows field effect transistor 144 with gate electrode 142 formed over gate dielectric 134. Openings 136 and 138 may remain open as shown in FIG. 31 or openings 136 and 138 may be processed to form an electrical contact to source 120 and drain 122 by filling openings 136 and 138 with a conductor.

Figure 32:
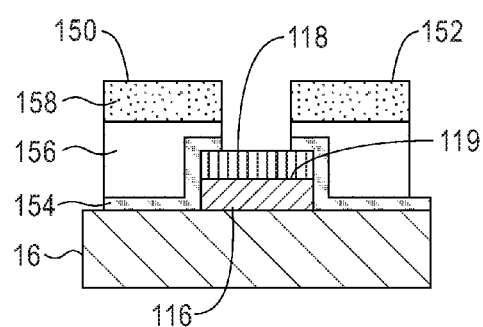
FIGS. 32-37 are cross-section views illustrating the process flow for forming an FET with a multilayer one-part source and drain, no additional source and drain dielectric, and reacted channel-protect residuals for the case of an insulating reactive layer.
Figure 35:
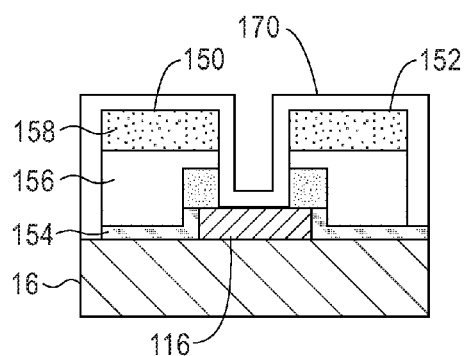
Figure 36:
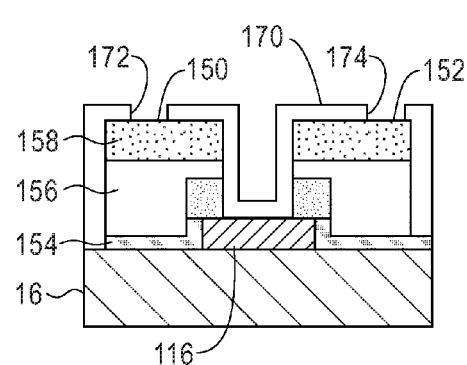
Figure 37:
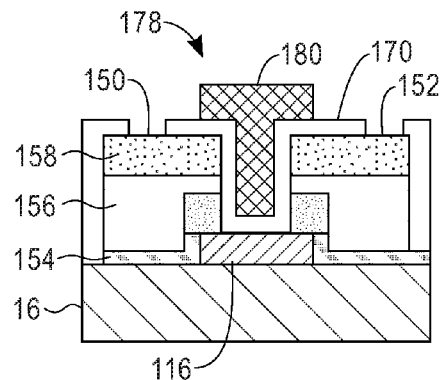

FIGS. 32-37 are cross-section views illustrating the process flow for forming field effect transistor 178 shown in FIG. 37 with a multilayer source 150 and drain 152 comprising a conductive diffusion barrier layer 156 sandwiched between an upper metallic layer 158 and a lower reactive layer 154 which may be insulating, where the conductive diffusion barrier layer 156 functions to ensure that the lower reactive layer 154 reacts only with patterned sacrificial metal layer 118 and not with the upper metallic layer 158. Referring to FIG. 32, an insulating substrate 16 is shown having a patterned carbon-based nanostructure layer 116, and a patterned sacrificial metal layer 118 on the upper surface 119 of patterned carbon-based nanostructure layer 116. Main metallic layer 158 is selected to have a high conductivity. As mentioned above, conductive diffusion barrier 156 functions to ensure that reactive layer 154 reacts only with patterned sacrificial metal layer 118 and not with main metal layer 158.

Figure 33:
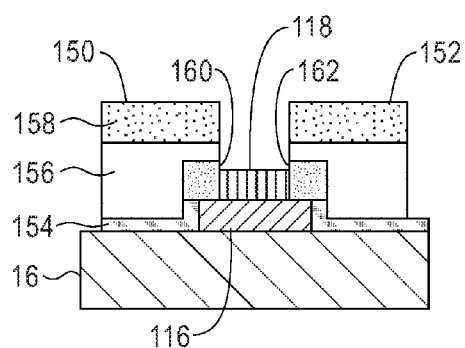

FIG. 33 shows reacted region 160 formed by sacrificial metal layer 118 reacting with insulating reactive layer 154 of source 150. Reacted region 162 is formed by sacrificial metal layer 118 reacting with reactive layer 154 of drain 152. Materials selected may be Ni for patterned sacrificial metal layer 118, Si for reactive layer 154, TiN for conductive diffusion barrier 156, $NiSi_x$ for reacted regions 160 and 162, and Pd for main metal layer 158. The above materials have the advantage that Ni+Si reactions occur in the range from 300° C. to 400° C. Reactions between Ni and C would not be expected to occur until the temperature is above 600° C. Another advantage is the availability of etchants that can etch Ni selectively with respect to Pd and $NiSi_x$, for example, chromium etchants CR-7 and CR-14 (aqueous mixtures of $(NH_4)_2Ce(NO_3)_6$ with $HClO_4$ or acetic acid) from Cyantek Corporation, 3055 Osgood Court, Fremont, Calif. 94538.

Figure 34:
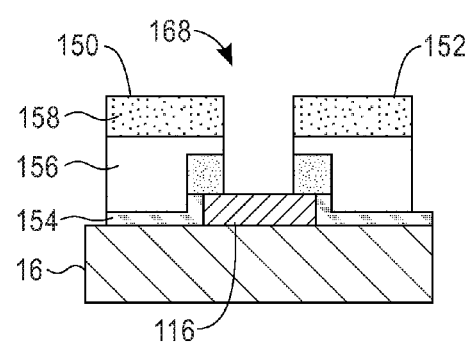

FIG. 34 is a cross-section view of structure 168 after sacrificial metal layer 118 is etched away. FIG. 35 shows a gate dielectric 170 formed over structure 168 of FIG. 34. FIG. 36 shows openings 172 and 174 in gate dielectric 170 to expose the upper surface of main metal layer 158 of source 150 and drain 152. FIG. 37 shows field effect transistor 178 with gate electrode 180 formed over gate dielectric 170. Openings 172 and 174 may remain open as shown in FIG. 37 or openings 172 and 174 may be processed to form an electrical contact to source 150 and drain 152 by filling openings 172 and 174 with a conductor.

Figure 38:
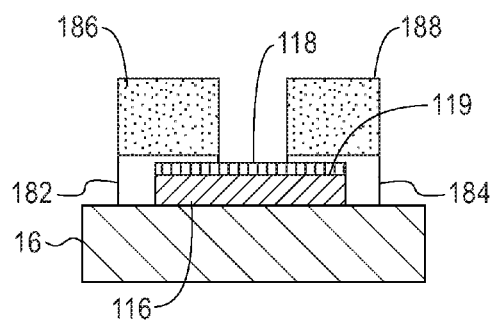
FIGS. 38-43 are cross-section views illustrating the process flow for forming an FET with a two-part source and drain comprising source and drain pads and source and drain extension regions, additional top source and drain dielectric, and reacted channel-protect residuals.
Figure 41:
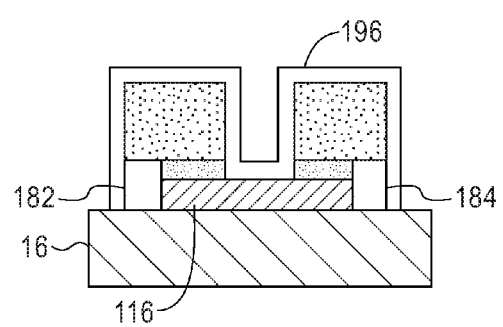
Figure 42:
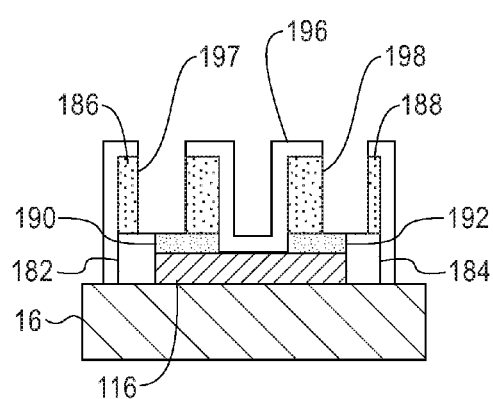
Figure 43:
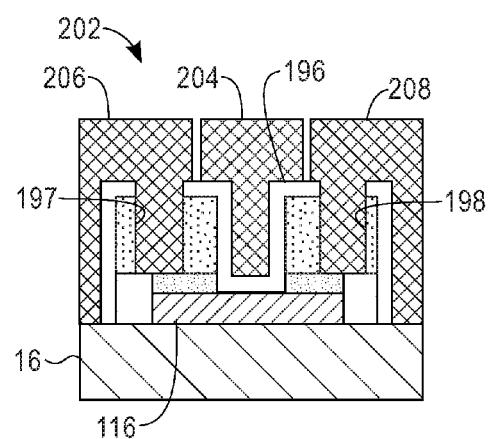

FIGS. 38-43 are cross-section views illustrating the process for forming field effect transistor 202 shown in FIG. 43 with additional top source/drain dielectric layer 186 and 188 and reacted channel-protect residuals 190 and 192. Referring to FIG. 38, an insulating substrate 16 is shown having a patterned carbon-based nanostructure layer 116, and a patterned sacrificial metal layer 118 on the upper surface 119 of patterned carbon-based nanostructure layer 116. Source 182 and drain 184 comprise a reactive layer such as amorphous Si or poly Si. Amorphous Si may be preferred over poly Si because amorphous Si can be deposited with a lower thermal budget i.e. at a lower temperature and reacted to form silicides, for example, with Ni. Above source 182 is a dielectric layer 186 which may be a self aligned insulator, for example, SiN. Above drain 184 is a dielectric layer 188 which may be a self aligned insulator, for example, SiN. Dielectric layers 186 and 188 function to reduce the capacitance between gate electrode 204 shown in FIG. 43 to be formed and source 182 and drain 184.

Figure 39:
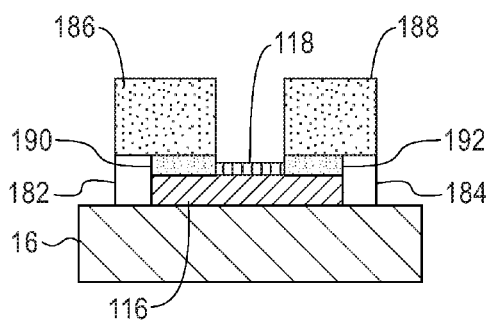

FIG. 39 shows reacted region 190 formed by sacrificial metal layer 118 reacting with source 182. Reacted region 192 is formed by sacrificial metal layer 118 reacting with drain 184. Materials selected may be Ni or Pd for patterned sacrificial metal layer 118, amorphous Si or poly Si for source 182 and drain 184, and NiSi for reacted regions 190 and 192. The above materials have the advantage that Ni+Si reactions occur in the range from 300° C. to 400° C. Reactions between Ni and C would not be expected to occur until the temperature is above 600° C. The conductivity of source 182 and drain 184 does not matter much as long as reacted regions 190 and 192 are large enough for contact with source electrode 206 and drain electrode 208, respectively, shown in FIG. 43.

Figure 40:
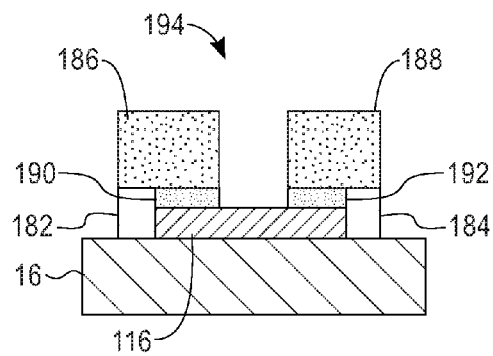

FIG. 40 is a cross-section view of structure 194 after sacrificial metal layer 118 is etched away. FIG. 41 shows a gate dielectric 196 formed over structure 194 of FIG. 40. FIG. 42 shows openings 197 and 198 in gate dielectric 196 and dielectric layers 186 and 188 respectively to expose the upper surface of reacted regions 190 and 192, source 182 and drain 184. FIG. 43 shows field effect transistor 202 with gate electrode 204 formed over gate dielectric 196, a source electrode 206 formed in opening 197 and a drain electrode 208 formed in opening 198.

Figure 44:
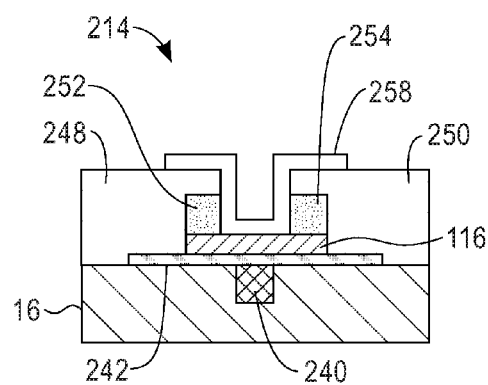
FIG. 44 is a cross-section view of a FET showing a gate dielectric extending beyond the bottom gate electrode and a carbon-based nanostructure layer.
Figure 45:
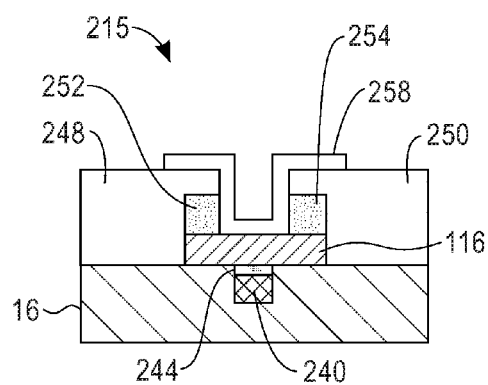
FIG. 45 is a cross-section view of a FET showing a gate dielectric patterned to cover the bottom gate electrode.
Figure 46:
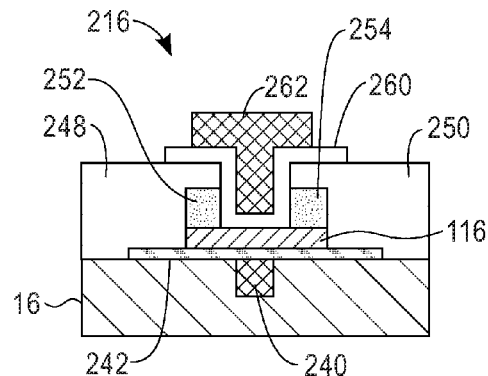
FIG. 46 is a cross-section view of a double gate FET showing the lower gate dielectric extending beyond the bottom gate electrode and a carbon-based nanostructure layer.
Figure 47:
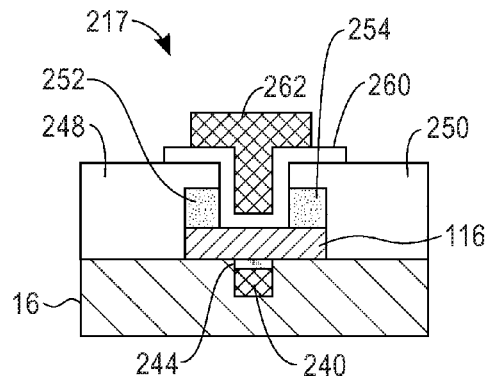
FIG. 47 is a cross-section view of a double gate FET showing the lower gate dielectric patterned to cover the bottom gate electrode.

In alternate embodiments, insulating substrate 16 shown in FIGS. 1-43 may include embedded bottom gates and bottom gate dielectrics fabricated by methods known to the art. FIGS. 44 and 45 show cross-section views of respective exemplary bottom gated field effect transistors 214 and 215 incorporating a carbon based nanostructure layer 116 and FIGS. 46-47 show cross-section views of respective exemplary double-gated field effect transistors 216 and 217 incorporating a carbon based nanostructure layer 116. In FIGS. 44-47, embedded bottom gates 240 and bottom gate dielectrics 242 and 244 are positioned under carbon based nanostructure layer 116 such as graphene and/or carbon nanotubes. Bottom gate dielectric 244 may be localized to or patterned to cover respective bottom gate 240 as shown in FIGS. 45 and 47. Bottom gate dielectric 242 may extend beyond respective bottom gate 240 and may extend beyond carbon-based nanostructure layer 116 and over a portion of insulating substrate 16 as shown in FIGS. 44 and 46.

The device structures of FIGS. 44-47 include source 248, drain 250 and channel-protect residuals 252 and 254, formed according to the methods described in the earlier figures such as FIGS. 29 and 31. Channel-protect residuals 252 and 254 may be as deposited or unreacted or reacted with a sacrificial metal layer as described above and shown in FIGS. 26-28. The device structures of FIGS. 44 and 45 show a passivating/protection layer 258. FIGS. 44 and 45 show bottom-gated field effect transistors 214 and 215 incorporating insulating passivating/protection layer 258 on carbon-based nanostructure layer 116. Insulating passivating/protection layer 258 may be localized to carbon-based nanostructure layer 116, or, as shown in FIGS. 44 and 45, extend beyond carbon-based nanostructure layer 116 over source 248 and drain 250. FIGS. 46 and 47 show double-gated field effect transistors 216 and 217 incorporating top gate dielectric 260 and top gate 262. Additional dielectric layers shown in FIGS. 21-23 may be incorporated in transistors 214-217 shown in FIGS. 44-47.

In FIGS. 2-47, like references are used for functions and apparatus illustrated or shown in an earlier Figure.

While there has been described and illustrated a method for forming Hall effect devices and field effect transistors incorporating a carbon-based nanostructure layer and utilizing a sacrificial metal layer thereover to protect the carbon-based nanostructure layer during processing, it will be apparent to those skilled in the art that modifications and variations are possible without deviating from the broad scope of the invention which shall be limited solely by the scope of the claims appended hereto.

What is claimed is:

1. A method for forming a device structure comprising:
   selecting an insulating substrate having a carbon-based nanostructure layer on an upper surface;
   forming a first layer of a first metal on said carbon-based nanostructure layer;
   forming a first patterned layer having a first pattern on said first layer of a first metal;
   transferring said first pattern to said first layer of a first metal and said carbon-based nanostructure layer to form a first patterned layer of a first metal and a first patterned carbon-based nanostructure layer there under;
   removing said first patterned layer;
   forming a layer of first material over said insulating substrate and said first patterned layer of a first metal, said layer of first material reactive with said first patterned layer of a first metal when raised to a predetermined temperature;
   forming a layer of second material over said layer of first material; said layer of second material providing an electrically conductive diffusion barrier with respect to said layer of first material;
   forming a second layer of metal over said layer of second material;
   patterning said layer of first material, layer of second material and said second layer of metal to form source and drain regions spaced apart wherein respective regions have a portion on said patterned metal and a portion on said insulating substrate;
   heating said layer of first material on said patterned metal to cause a reaction there between for forming a reacted region of one of a chemical compound and an alloy; and
   selectively removing un-reacted patterned metal to expose said patterned carbon-based nanostructure layer between said source region and said drain region.

2. The method of claim 1 wherein said carbon-based nanostructure layer is selected from the group consisting of carbon-nanotubes and graphene.

3. The method of claim 1 wherein said first metal includes metal selected from the group consisting of Ni, Pd, amorphous silicon and polysilicon.

4. The method of claim 1 wherein forming said layer of second material is omitted.

5. The method of claim 1 further including:
forming a dielectric layer over said exposed patterned carbon-based nanostructure layer, sidewalls of said reacted region, sidewalls of said layer of second material, sidewalls of said second layer of metal and upper surface of said second layer;
forming a third layer of metal over said dielectric layer; and
patterning said third layer of metal to form an electrode on said dielectric layer over said regions of patterned carbon-based nanostructure layer located between said drain and source regions.

6. The method of claim 1 wherein
said forming a layer of second material provides an insulator in place of a conductive diffusion barrier;
wherein forming a second layer of metal over said layer of second material is deleted and
wherein patterning said second layer of metal is not performed.

7. The method of claim 6 further including:
forming a dielectric layer over said exposed patterned carbon-based nanostructure layer, sidewalls of said reacted region, sidewalls of said layer of second material, and upper surface of said layer of second material;
patterning said dielectric layer and said layer of second material to form openings in said dielectric layer and said layer of second material to said reacted regions and said layer of first material forming a respective source region and drain region;
forming a third layer of metal over said dielectric layer and said openings; and
patterning said third layer of metal to form a source electrode, drain electrode and gate electrode, said gate electrode on said dielectric layer over said regions of patterned carbon-based nanostructure layer located between said drain and source regions.

* * * * *